(12) United States Patent
Brokaw

(10) Patent No.: US 6,304,109 B1
(45) Date of Patent: Oct. 16, 2001

(54) HIGH GAIN CMOS AMPLIFIER

(75) Inventor: A. Paul Brokaw, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/730,651

(22) Filed: Dec. 5, 2000

(51) Int. Cl.[7] .................................................. H03K 5/153
(52) U.S. Cl. .............................. 327/73; 327/72; 327/560; 327/563
(58) Field of Search ................................. 327/72, 73, 560, 327/561, 562, 563; 330/257, 260, 282, 288, 291

(56) References Cited

U.S. PATENT DOCUMENTS

| | | | |
|---|---|---|---|
| 4,857,862 | 8/1989 | Brokaw | 30/261 |
| 4,893,092 | * 1/1990 | Okamoto | 330/253 |
| 5,463,339 | * 10/1995 | Riggio, Jr. | 327/206 |
| 6,166,587 | * 12/2000 | Burzio et al. | 327/583 |

* cited by examiner

Primary Examiner—Tuan T. Lam
Assistant Examiner—Hiep Nguyen
(74) Attorney, Agent, or Firm—Koppel & Jacobs

(57) ABSTRACT

A CMOS amplifier includes a FET differential input stage, with the input transistors' sources connected to a common tail current. A first current mirror reflects the drain current from one input FET to the other at a first node. A pair of FETs are connected to conduct respective currents in response to the voltage at the first node. One of the currents drives a load at a second node, which is connected to one of the input stage gates such that the output voltage tracks an input voltage applied to the other input stage gate. The other current is reflected via a second current mirror to provide the common tail current. By properly sizing the FETs to achieve particular current densities, the tail current is automatically varied to adjust the operating point of the differential input stage such that, when the amplifier is in equilibrium, the drain voltages of the input FETs are kept equal over a wide range of output currents. The amplifier is suitably combined with a bandgap cell to produce a precision reference voltage.

11 Claims, 2 Drawing Sheets

HIGH GAIN CMOS AMPLIFIER

BACKGROUND OF THE INVENTION

1. Field of the Invention

This invention relates to the field of amplifiers, and particularly to CMOS amplifiers having high gain.

2. Description of the Related Art

A wide variety of circuit designs have been used to realize integrated circuit (IC) amplifiers. Operational amplifiers are employed extensively, and usually comprise a differential input stage and a single-ended output stage.

Although such amplifiers have served many practical purposes, their performance is not fully satisfactory in certain respects. For example, the gain of many prior amplifiers tends to be low, or to vary to an undesired degree with changes in load, due to variations in ambient temperature, for example. When used in an application such as a high precision voltage reference, such variation can adversely affect circuit performance to an unacceptable degree.

One high gain IC amplifier is described in U.S. Pat. No. 4,857,862 to Brokaw. The operating point of this amplifier is automatically adjusted to keep the amplifier balanced over changes in load. However, this amplifier is designed to operate only with bipolar transistors; for example, it is arranged so that the effects of several base currents compensate one other, thereby improving performance. As a result, this bipolar amplifier is ill-suited for use in a CMOS circuit.

SUMMARY OF THE INVENTION

A CMOS amplifier is presented which provides high gain from a simple circuit. The amplifier is suitably combined with a bandgap cell to provide a high precision voltage reference circuit.

The amplifier includes a differential input stage made from a pair of field-effect transistors (FETs) having their sources connected to a common tail current. A first current mirror reflects the drain current from one of the pair transistors to the other at a first node. A pair of FETs are connected to conduct an output current and an adjustment current in response to the voltage at the first node. The output current drives a load at a second node, which is connected to one of the input stage gates via a feedback path such that the output voltage tracks an input voltage applied to the other input stage gate. The adjustment current is reflected via a second current mirror to provide the common tail current. The amplifier is arranged to vary the tail current with the output current such that the operating point of the differential input stage is automatically adjusted to keep the drain voltages of the first and second FETs equal when the amplifier is in equilibrium. By reducing the differential voltage between the drain voltages over a wide output current range, gain error is reduced and gain increased. The tail current is made to adjust as described by arranging the adjustment current transistor and the transistors of the first current mirror to have equal current densities when the amplifier is in an equilibrium state.

The amplifier is suitably combined with a bandgap cell to produce a voltage reference circuit. Additional FETs, all in controlled ratio to one another, are connected to conduct respective currents in response to the voltage at the first node; these currents and the current at the second node drive an array of bipolar transistors and resistors arranged in a bandgap cell configuration, with the outputs of one of the additional FETs connected to the open input stage gate. The amplifier detects when the two input lines differ in voltage, and automatically adjusts the magnitude of the fixed ratio output currents to bring the voltages to balance. The amplifier keeps the input nodes balanced over variations in temperature, supply voltage, etc., thereby enabling a bandgap reference voltage to be generated.

Further features and advantages of the invention will be apparent to those skilled in the art from the following detailed description, taken together with the accompanying drawings.

DETAILED DESCRIPTION OF THE INVENTION

Figure 1:
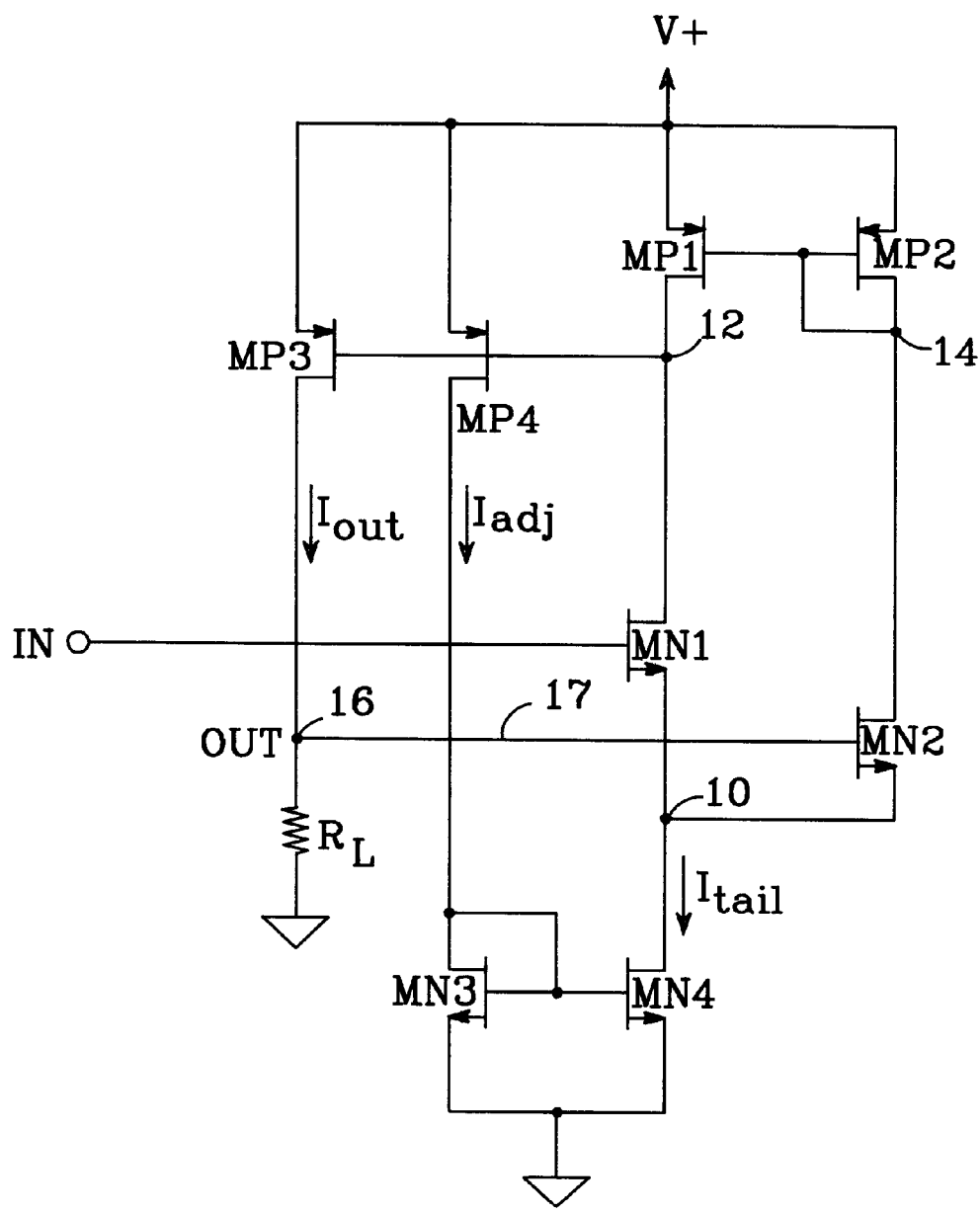
FIG. 1 is a schematic diagram illustrating the basic principles of the present amplifier.

The basic principles of a high gain CMOS amplifier in accordance with the present invention is shown in FIG. 1. A pair of NMOS FETs MN1 and MN2 form a differential input stage, with the gate of MN1 serving as the amplifier's input IN. The sources of MN1 and MN2 are connected together at a node 10, which is connected to a source of tail current $I_{tail}$ that will be described below. A current mirror made from a pair of PMOS FETs MP1 and MP2 is connected between the input stage and a positive supply voltage V+, with MN1's drain connected to MP1 at a node 12 and MN2's drain connected to transistor MP2 at a node 14. MP2 is the mirror's input transistor and MP1 provides the output, such that MN2's drain current is reflected to MN1 and node 12.

Node 12 is connected to drive at least two additional PMOS FETs MP3 and MP4, each of which has its gate connected to node 12 and its source connected to V+ so that each conducts a respective current that varies with the node 12 voltage. MP3 serves as an output transistor, conducting an output current $I_{out}$ which is connected to drive a load $R_L$ at a node 16; node 16 thus serves as the output OUT of the amplifier. Node 16 is also connected to the gate of input stage transistor MN2 via a feedback path 17, thereby forming a feedback loop around the amplifier. Note that though feedback path 17 is shown as a direct connection between node 16 and the gate of MN2 in FIG. 1, such a direct connection is not required. It is only necessary for proper operation that the output signal get back to the gate of MN2 via some feedback path.

When an appropriate tail current is provided at node 10, the output voltage at OUT will track the voltage applied to IN. If the tail current is fixed, the voltages at nodes 12 and 14 will be balanced for one particular value of $I_{out}$. However, if $I_{out}$ deviates from that value, due to a change in temperature or in load $R_L$, for example, there must be a corresponding change in the node 12 voltage, which in turn results in an imbalance in the currents in MP1 and MP2. This imbalance represents a gain error which adversely affects the precision with which the output voltage tracks the input voltage.

The invention remedies this problem by making the tail current $I_{tail}$ vary with the voltage at node 12 such that the voltages at nodes 12 and 14 are kept in balance despite changes in $I_{out}$, reducing the gain error and thereby improving the performance of the amplifier. As noted above, transistor MP4 is connected to conduct a current $I_{adj}$ that varies with the voltage at node 12. This current is fed to a second current mirror made from a pair of NMOS FETs MN3 and MN4 connected between node 10 and circuit common; MN3 is the mirror's input transistor and MN4 provides the output, so that $I_{adj}$ is reflected to node 10 to provide the tail current for the differential input stage. When so configured, a change in the voltage at node 12 results in a change in current $I_{adj}$, which in turn alters $I_{tail}$, and thus amplifier's operating point.

When the relationship between $I_{tail}$ and the node 12 voltage is properly established, the operating point is varied such that the voltages at nodes 12 and 14 are kept in balance over a wide range of output currents. This relationship is correct when the current density in MP4 is equal to that in MP1 and MP2. This can be achieved in a number of ways. One way is to make MN1 and MN2 match, MP1 and MP2 match, and to make MP4 match MP1 and MP2. Then, because the MP4 current mirrored by MN3 and MN4 must supply both MP1 and MP2, the MN3/MN4 mirror ratio is made 1:2, thereby making a current equal to $I_{adj}$ available to each of MP1 and MP2 when the gates of MN1 and MN2 are at equal voltage and the tail current is evenly divided between their drains. As used herein, transistors are "matched" when they are sized to conduct equal currents for equal gate-source voltages; ratio matching as described herein is preferably accomplished by varying the channel widths of FETs which have equal channel lengths.

When the amplifier is configured in this way, $I_{tail}$ is automatically adjusted to equal twice the current in MP4, and the currents in MN1, MN2, MP1, and MP2 will be equal when the amplifier is at equilibrium. This makes the drain voltages of MN1 and MN2 equal, giving the amplifier a very low gain error and a very high gain. Assuming MP4 and MP3 are matched so that $I_{adj}$ tracks $I_{out}$, these advantages are maintained over a wide range of output currents, enabling the output voltage at node 16 (OUT) to precisely track an input voltage applied to IN.

An alternative way of achieving the necessary current density relationship is to make MP4 twice as wide as MP1 or MP2, so that it conducts a current $I_{adj}$ that is twice that found in MP1 or MP2, and which is equal to the desired sum of the currents in MP1 and MP2. Then the MN3/MN4 mirror ratio is made 1:1. Generalizing, the ratio of the MN3/MN4 mirror from input to output is made equal to the ratio of the sum of the MP1 and MP2 width divided by the MP4 width.

The described arrangement also serves to automatically minimize the amplifier's offset voltage, whereas a fixed tail current is likely to result in an offset that is either always more or less than zero.

Note that while the amplifier is shown and described as implemented with NMOS and PMOS FETs in prescribed locations, an opposite polarity version of the amplifier is equally useful. In this case, the drain voltages of a PMOS input stage are mirrored with an NMOS current mirror, NMOS FETs provide the output and adjustment currents, and a PMOS current mirror provides the input stage's tail current.

The present amplifier is well-suited for use as part of a voltage reference circuit, in which the amplifier is used to stabilize the operating point of a bandgap cell. Such an application is shown on the right side of the schematic shown in FIG. 2. The amplifier is configured as before, with the drains of differential input stage MN1/MN2 connected to current mirror MP1/MP2 at nodes 12 and 14, respectively, and node 12 driving transistors MP3 and MP4 to conduct currents $I_{out}$ and $I_{adj}$ to node 16 and current mirror MN3/MN4, respectively, with the drain of MN4 providing adjustable tail current $I_{tail}$.

An array of bipolar transistors and resistors is arranged in a bandgap cell configuration, and a row of PMOS current sources MP5-MP9 are connected in parallel with MP3 and MP4 and are driven to conduct respective currents to the array. The bandgap cell includes three pairs of PNP transistors: Q1–Q2, Q3–Q4, and Q5–Q6. Q1, Q3, and Q5 are stacked above circuit common and driven with currents conducted by MP3, MP5 and MP6, respectively, such that the emitter of Q5 is three base-emitter voltages above common. Similarly, PNP transistors Q2, Q4, and Q6 are stacked above circuit common and driven with currents conducted by MP7, MP8 and MP9, respectively, such that the emitter of Q6 is three base-emitter voltages above common. A resistor R1 is connected between node 16 and the emitter of Q5, and a resistor P2 is connected between MP8 and the emitter of Q4. The junction of MP8 and R2 is a node 20, and the emitter of Q6 is connected to the gate of input stage transistor MN1 at a node 21.

The currents provided by MP3, MP5, MP6 to Q1, Q3 and Q5 are in a fixed ratio to those provided by MP7, MPB, MP9 to Q2, Q4 and Q6. This causes the base-emitter voltages of each pair of bipolar transistors to differ, with the difference $\Delta V_{be}$ given by:

$$\Delta V_{be}=(kT/q)ln(J1/J2) \quad\quad\quad (\text{Eq.1})$$

where J is the respective current density for each transistor in the pair. Though the currents supplied by the PMOS current sources vary with temperature, the current ratios between them do not, so that the difference between the emitter voltages of Q1 and Q2 is fixed, as is the difference between the emitter voltages of Q3 and Q4, and of Q5 and Q6. These differences are summed as one moves up the stack, thereby producing a substantial differential voltage between the emitters of Q5 and Q6. Thus, even if the node 12 voltage varies, causing the outputs of MP3 and MP5–MP9 and the base-emitter voltages of Q1–Q6 to vary, the differential voltage between the emitters of Q5 and Q6 remains invariant.

The current $I_{out}$ provided to bipolar transistor Q5 also flows through resistor R1, so that the voltage drop across R1, and thus the voltage at node 16, varies with $I_{out}$. If $I_{out}$ increases, node 16 rises with respect to node 21; the amplifier reacts as described above to restore equilibrium, thereby making the node 21 voltage equal to the node 16 voltage. At this equilibrium, the voltage across R1 must be the difference between the emitter voltages of Q6 and Q5. Since the device sizes, current ratios, and J1/J2 are invariant in each pair of bipolar transistors, and k and q are constants, the voltage across R1 (per equation 1) must be proportional to absolute temperature (PTAT), and this voltage will be maintained by the continuing equilibrium of the amplifier loop.

The PTAT voltage across R1 makes R1's current PTAT. R2's current is proportional to that in R1, making R2's current, and thus its voltage, PTAT as well. The voltage at the emitter of Q4 is two base-emitter voltages above circuit common, and thus has a negative temperature coefficient (TC). The voltage at the top of R2 (node 20) is the sum of this negative TC and the positive TC of the R2 voltage. When this sum is arranged to equal twice the extrapolated bandgap of silicon, the negative and positive TCs complement, resulting in a node 20 voltage (labeled "$V_{ref}$") having a TC of nearly zero. Thus, node 20 serves as the output of the voltage reference circuit.

As an example, assume that the channel widths of MP7–MP9 are 10 times the widths of MP3, MP5 and MP6. Further assume that the emitter areas of Q1, Q3 and Q5 are 8 times that of Q2, Q4 and Q6. This makes the current density ratios for each pair of bipolar transistors equal to 80:1. Per equation 1, $\Delta V=(kT/q)\ln(80)\approx 113$ mv, which is the difference between the emitter voltages of Q2 and Q1 at room temperature. The $\Delta V_{be}$ accumulate as one moves up the stack, so that the voltage difference between the emitters of Q5 and Q6 is about equal to $3\times 113$ mv$\approx 339$ mv. The ratio of R2 and R1 is selected to provide a PTAT voltage across R2 which just compensates for the two base-emitter voltages at the emitter of Q4 and sums to twice the bandgap voltage.

Alternatively, a voltage reference equal to a single bandgap can be made by putting a resistor half the size of R2 in series with Q2, or equal to three bandgaps by putting a resistor which is 1.5 times the size of R2 in series with Q6.

Figure 2:
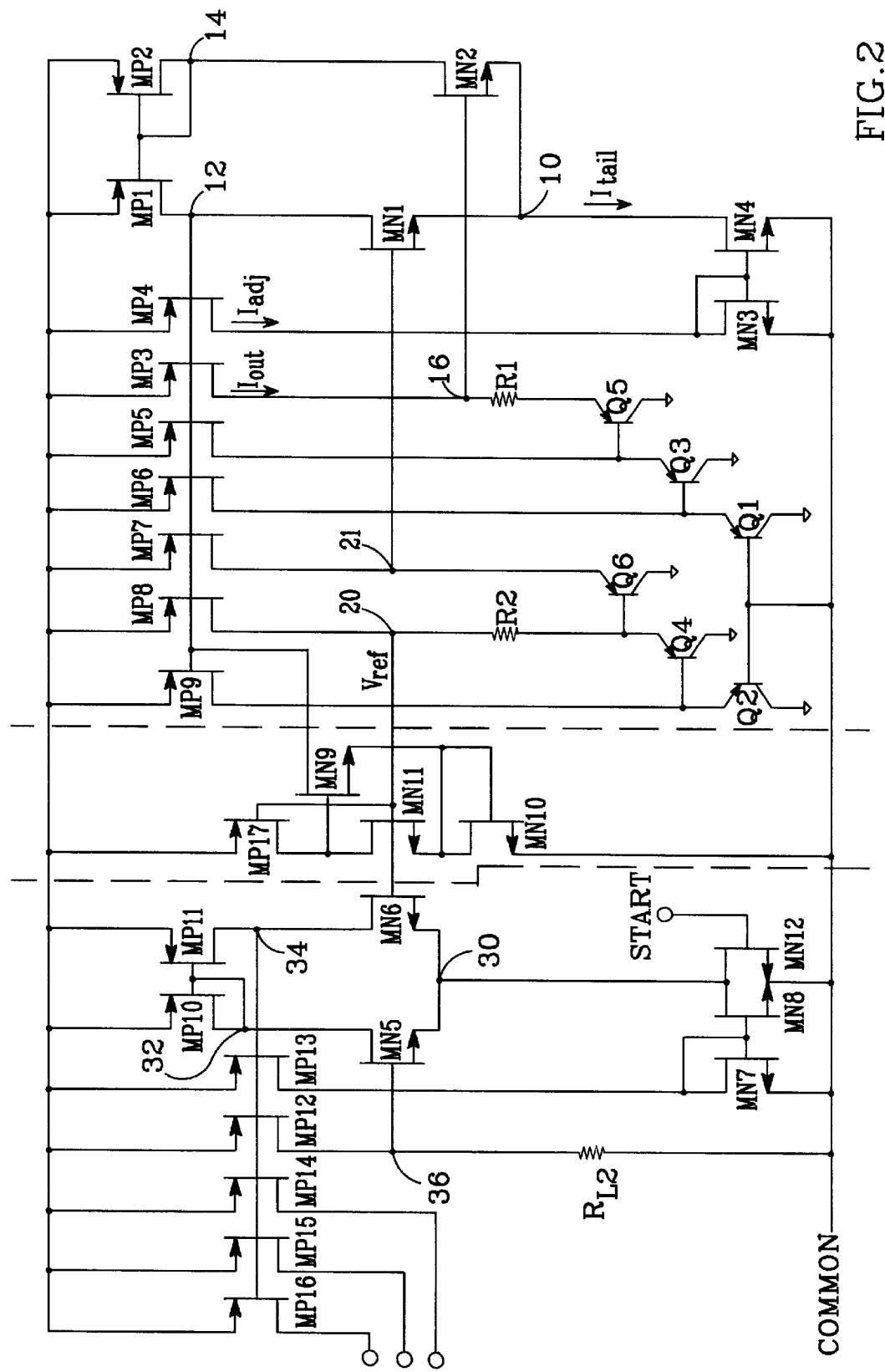
FIG. 2 is a schematic diagram illustrating two possible applications of the present invention.

For reliable operation, it is essential that the common mode voltage at nodes 21 and 16 exceed $V_{gs}-V_T$ of MN1 or MN2 and MN3. Using three pairs of bipolar transistors as shown in FIG. 2 provides a common mode voltage which meets this requirement, even at high temperatures. Thus, when using the present CMOS amplifier for this application, the bandgap cell should include at least three pairs of bipolar transistors.

Another possible application of the amplifier is as a source of fixed bias currents, as shown on the left side of FIG. 2. The amplifier is configured as before: a differential input stage is formed from a pair of FETs MN5 and MN6 having their sources connected to a node 30 and their drains connected to a current mirror comprising MP10 and MP11 at a pair of nodes 32 and 34, respectively. Node 34 drives a pair of transistors MP12 and MP13, with MP12 conducting a current to a load $R_{L2}$ at a node 36, and MP13 conducting a current to a current mirror formed from MN7 and MN8, which provides the adjustable tail current to the input stage FETs. The gate of MN5 is connected to node 36, and the gate of MN6 is connected to receive the reference voltage $V_{ref}$ produced by the amplifier and bandgap cell on the right side of the schematic.

Variability of $R_{L2}$ from circuit to circuit or due to temperature would normally cause the amplifier to depart from equilibrium, causing the voltage at node 36 to differ from $V_{ref}$, and the voltage at node 34 to differ from that at node 32. However, by using MN7 and MN8 to mirror the operating current of MP13 to make the adjustable tail current, equilibrium is maintained over a wide range of output currents. Node 34 can then be used to drive additional FETs MP14–MP16 connected in parallel with MP12 and MP13, to produce bias currents which are proportional to the MP12 current. Connecting the current outputs of these additional FETs to drive resistors of the same material as $R_{L2}$ enables voltages of comparable stability to $V_{ref}$ to be created. Additional FETs might also be connected in parallel with tail current mirror FET MN8 to provide N type biasing for other circuits.

The present amplifier is self-biasing, and as such has a stable off state which may cause starting problems. One possible solution is shown in FIG. 2, which depicts a starting circuit comprising transistors MP17 and MN9–MN11. MP17 is controlled by the voltage at node 20 ($V_{ref}$); when $V_{ref}$ is zero, MP17 is biased on and pulls up the gate of MN9. This causes MN9 to be turned on, which pulls down on node 12 and forward-biases diode-connected transistor MN10. As node 12 goes low, currents are directed to nodes 16 and 20 (among others), making some tail current $I_{tail}$ available to the MN1/MN2 input stage and regeneratively starting the amplifier.

Once the amplifier is started, it is essential that MN9 be turned off. As $V_{ref}$ comes up, transistor MN7 is turned on. MP17 and MN7 are arranged such that, when on, MN7 easily absorbs the current conducted by MP17 and thus pulls down the gate of MN9 and turns it off. Note, however, that this does not occur until $V_{ref}$ exceeds the forward voltage drop of MN10 and the threshold voltage of MN11 combined. This ensures that the amplifier is well and safely on before MN9 is turned off.

To start the amplifier on the left side of FIG. 2, an additional FET MN12 is connected between node 30 and circuit common. After $V_{ref}$ comes up, MN12 is driven (via a START signal applied to its gate) to inject a small tail current at node 30, forcing the loop away from the stable off condition. This small current corrupts the exact ratio of input to output current in the MN7/MN8 current mirror. Thus, for ultimate performance, the MN12 current should be turned off once the amplifier has been started.

Note that the starting schemes discussed above and shown in FIG. 2 are merely exemplary; many different methods might be employed to start the present amplifier.

While particular embodiments of the invention have been shown and described, numerous variations and alternate embodiments will occur to those skilled in the art. Accordingly, it is intended that the invention be limited only in terms of the appended claims.

I claim:

1. An amplifier, comprising:
   a differential input stage comprising first and second field-effect transistors (FETs) having their sources connected to a first node, the gate of said first FET providing said amplifier's input,
   a first current mirror comprising a third FET connected to the drain of said second FET and a fourth FET connected to the drain of said first FET at a second node, said first current mirror arranged to mirror the drain current of said second FET to said first FET at said second node,
   a fifth FET connected to conduct a current in response to the voltage at said second node,
   a second current mirror arranged to mirror the current conducted by said fifth FET to said first node and thereby provide a tail current for said differential input stage which varies with the voltage at said second node,
   an output FET connected to a load at a third node and arranged to conduct an output current to said load in response to the voltage at said second node, said third node being said amplifier's output, and
   a feedback path between said third node and the gate of said second FET such that the voltage at said third node tracks a voltage applied to said amplifier's input,
   said amplifier arranged such that said tail current adjusts the operating point of said differential input stage such that the drain voltages of said first and second FETs are about equal when said amplifier is in equilibrium.

2. The amplifier of claim 1, wherein said amplifier is arranged such that the current densities in said third, fourth, and fifth FETs are about equal when said amplifier is in equilibrium.

3. The amplifier of claim 2, wherein said first and second FETs are matched, said third, fourth, and fifth FETs are matched, and said sixth and seventh FETs are sized to provide a current mirror ratio of about 1:2.

4. The amplifier of claim 2, wherein the channel lengths of said third, fourth and fifth FETs are about equal and the channel width of said fifth FET is about twice that of said third and fourth FETs, and said sixth and seventh FETs are sized to provide a current mirror ratio of about 1:1.

5. The amplifier of claim 1, further comprising a sixth FET connected to a load at a fourth node and arranged to conduct a current in response to the voltage at said second node, said fourth node connected to said amplifier's input such that said amplifier operates to keep the voltages at said third and fourth nodes about equal.

6. The amplifier of claim 5, further comprising a plurality of additional FETs arranged to conduct respective currents in response to the voltage at said second node and an array of bipolar transistors and resistors arranged to form a bandgap cell, the drain currents of said sixth FET, said output FET, and said additional FETs connected to establish predetermined current density ratios in respective pairs of said bipolar transistors to create $\Delta V_{be}$'s between the bipolar transistors of each pair which vary proportionally with temperature, said cell arranged such that at least one of said $\Delta V_{be}$'s is forced across one of said resistors to create a proportional-to-absolute-temperature (PTAT) voltage which is summed with the base-emitter voltage of at least one of said bipolar transistors to create a reference voltage having a temperature coefficient of about zero.

7. The amplifier of claim 6, wherein said bandgap cell comprises:

first, second and third bipolar transistors of a first size connected to respective ones of said FETs and stacked such that, when conducting respective currents, the voltage at the emitter of said third transistor is the sum of the base-emitter voltages of said first, second and third bipolar transistors, fourth, fifth and sixth bipolar transistors of a second size stacked such that, when conducting respective currents, the voltage at the emitter of said sixth transistor is the sum of the base-emitter voltages of said fourth, fifth and sixth bipolar transistors, a first resistor connected between the emitter of said third bipolar transistor and said third node, and a second resistor, one end of said second resistor connected to the emitter of said fifth bipolar transistor and the other end of said second resistor connected to said fifth bipolar transistor's respective FET at a fifth node, said bandgap cell arranged such that the voltage at said fifth node has a temperature coefficient of about zero, the voltage at said fifth node being said reference voltage.

8. The amplifier of claim 1, further comprising a starting circuit which injects a current at said second node to force said amplifier away from a stable off state.

9. A voltage reference circuit, comprising:

an amplifier, comprising:
a differential input stage comprising first and second field-effect transistors (FETs) having their sources connected to a first node,
a first current mirror comprising a third FET connected to the drain of said second FET and a fourth FET connected to the drain of said first FET at a second node, said first current mirror arranged to mirror the drain current of said second FET to said first FET at said second node,
a fifth FET connected to conduct a current in response to the voltage at said second node,
a second current mirror arranged to mirror the current conducted by said fifth FET to said first node and thereby provide a tail current for said differential input stage which varies with the voltage at said second node, and
first and second output FETs connected to conduct respective output currents to third and fourth nodes, respectively, in response to the voltage at said second node, the gates of said first and second FETs connected to said third and fourth nodes, respectively,
said amplifier arranged such that said tail current adjusts the operating point of said differential input stage such that the drain voltages of said first and second FETs, and thereby the voltages at said third and fourth nodes, are about equal when said amplifier is in equilibrium, a plurality of additional FETs connected to conduct respective output currents in response to the voltage at said second node, and a bandgap cell comprising an array of bipolar transistors and resistors, the output currents of said first and second output FETs and said additional FETs connected to establish predetermined current density ratios in respective pairs of said bipolar transistors to create $\Delta V_{be}$'s between the bipolar transistors of each pair which vary proportionally with temperature, said cell arranged such that at least one of said $\Delta V_{be}$'s is forced across one of said resistors to create a proportional-to-absolute-temperature (PTAT) voltage which is summed with the base-emitter voltage of at least one of said bipolar transistors to create a reference voltage having a temperature coefficient of about zero.

10. The voltage reference circuit of claim 9, wherein said amplifier is arranged such that the current densities in said third, fourth, and fifth FETs are about equal when said amplifier is in equilibrium.

11. The voltage reference circuit of claim 9, wherein said bandgap cell comprises:

first, second and third bipolar transistors of a first size connected to respective ones of said FETs and stacked such that, when conducting respective currents, the voltage at the emitter of said third transistor is the sum of the base-emitter voltages of said first, second and third bipolar transistors, fourth, fifth and sixth bipolar transistors of a second size stacked such that, when conducting respective currents, the voltage at the emitter of said sixth transistor is the sum of the base-emitter voltages of said fourth, fifth and sixth bipolar transistors, a first resistor connected between the emitter of said third bipolar transistor and said third node, and a second resistor, one end of said second resistor connected to the emitter of one of said fourth, fifth and sixth bipolar transistors and the other end connected to that bipolar transistor's respective FET at a fifth node, said bandgap cell arranged such that the voltage at said fifth node has a temperature coefficient of about zero, the voltage at said fifth node being said reference voltage.

* * * * *